(12) United States Patent
Gupta et al.

(10) Patent No.: US 11,832,525 B2
(45) Date of Patent: Nov. 28, 2023

(54) DUAL MAGNETIC TUNNEL JUNCTION STACK

(71) Applicants: IMEC vzw, Leuven (BE); Katholieke Universiteit Leuven, Leuven (BE)

(72) Inventors: Mohit Gupta, Heverlee (BE); Trong Huynh Bao, Leuven (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 419 days.

(21) Appl. No.: 17/119,010

(22) Filed: Dec. 11, 2020

(65) Prior Publication Data
US 2021/0193912 A1 Jun. 24, 2021

(30) Foreign Application Priority Data
Dec. 18, 2019 (EP) ...................................... 19217439

(51) Int. Cl.
*H10N 50/10* (2023.01)
*G11C 11/16* (2006.01)
(Continued)

(52) U.S. Cl.
CPC ........... *H10N 50/10* (2023.02); *G11C 11/161* (2013.01); *G11C 11/1655* (2013.01);
(Continued)

(58) Field of Classification Search
CPC ........ H10N 50/10; H10N 50/80; H10N 50/85; G11C 11/161; G11C 11/1655;
(Continued)

(56) References Cited

U.S. PATENT DOCUMENTS 10,170,694 B1 1/2019 Shirotori et al.
2015/0070981 A1 3/2015 Kumura
(Continued)

FOREIGN PATENT DOCUMENTS

WO WO 2016/190879 A1 12/2016
WO WO 2018/080159 A1 5/2018
WO WO 2018/136003 A1 7/2018

OTHER PUBLICATIONS

Ahmed et al., "Area-Efficient Multibit-per-Cell Architecture for Spin-Orbit-Torque Magnetic Random-Access Memory With Dedicated Diodes", IEEE Magnetics Letters, vol. 9 (2018), 5 pages.
(Continued)

*Primary Examiner* — Jami Valentine Miller
(74) *Attorney, Agent, or Firm* — Knobbe Martens Olson & Bear, LLP

(57) ABSTRACT

The material layer stack includes first and second magnetic tunnel junctions and a first top electrode formed on a top face of the stack. A shoulder is formed on a lateral face of the stack and divides the stack into a lower portion and an upper portion. A tunnel barrier of the first magnetic tunnel junction is comprised by the lower stack portion and a tunnel barrier of the second magnetic tunnel junction by the upper stack portion. A second top electrode is formed on the shoulder. Each magnetic tunnel junction is adapted to store a bit as a reconfigurable magnetoresistance of its magnetic electrodes. Preferably, a bottom face of the stack is connected to a conductor supporting current induced magnetic polarization switching for the first magnetic tunnel junction by spin-orbit torque. Magnetic polarization switching for the second magnetic tunnel junction is preferably achieved by spin-transfer torque.

19 Claims, 6 Drawing Sheets

(51) Int. Cl.
  *H01F 10/32* (2006.01)
  *H10N 50/80* (2023.01)
  *H10N 50/85* (2023.01)

(52) U.S. Cl.
  CPC ...... *G11C 11/1657* (2013.01); *G11C 11/1673* (2013.01); *G11C 11/1675* (2013.01); *H01F 10/329* (2013.01); *H01F 10/3286* (2013.01); *H10N 50/80* (2023.02); *H10N 50/85* (2023.02)

(58) Field of Classification Search
  CPC ............ G11C 11/1657; G11C 11/1673; G11C 11/1675; H01F 10/3286; H01F 10/329
  USPC .......................................................... 257/421
  See application file for complete search history.

(56) References Cited

U.S. PATENT DOCUMENTS

| | | | |
|---|---|---|---|
| 2017/0077394 A1* | 3/2017 | Saida | .................. G11C 11/1673 |
| 2018/0144240 A1 | 5/2018 | Garbin et al. | |
| 2018/0277184 A1 | 9/2018 | Zhao et al. | |
| 2018/0366172 A1* | 12/2018 | Wang | .................... G11C 11/161 |
| 2019/0067561 A1 | 2/2019 | Avci et al. | |
| 2019/0115060 A1 | 4/2019 | Deshpande et al. | |
| 2019/0206472 A1 | 7/2019 | Bozdag et al. | |
| 2019/0287594 A1 | 9/2019 | Osada et al. | |
| 2020/0005861 A1* | 1/2020 | O'Brien | .............. H01F 10/3272 |
| 2020/0006628 A1* | 1/2020 | O'Brien | .............. H01F 10/3272 |
| 2020/0402558 A1* | 12/2020 | Phung | ................. H01F 10/3254 |
| 2021/0125650 A1* | 4/2021 | Jung | ...................... H10B 61/00 |
| 2023/0133050 A1* | 5/2023 | Rai | ......................... G11C 7/065 |
| | | | 365/208 |

OTHER PUBLICATIONS

Baek et al., "Novel Operation of a Multi-Bit SOT Memory Cell Addressed With a Single Write Line", IEEE Transactions on Magnetics, vol. 53, No. 11, Nov. 2017, 5 pages.

Chang et al., "PXNOR-BNN: In/With Spin-Orbit Torque MRAM Preset-XNOR Operation-Based Binary Neural Networks", IEEE Transactions on Very Large Scale Integration (VLSI) Systems, vol. 27, No. 11, Nov. 2019, pp. 2668-2679.

Pan et al., "A Multilevel Cell STT-MRAM-Based Computing In-Memory Accelerator for Binary Convolutional Neural Network", IEEE Transactions on Magnetics, vol. 54, No. 11, Nov. 2018, 5 pages.

Parveen et al., IMCS2: Novel Device-to-Architecture Co-Design for Low-Power In-Memory Computing Platform Using Coterminous Spin Switch, IEEE Transactions on Magnetics, vol. 54, No. 7, Jul. 2018, 14 pages.

Prajapati et al., "Novel compact model for multi-level spin torque magnetic tunnel junctions", Proc. SPIE 9931, Spintronics IX, 99310I (Sep. 26, 2016); doi: 10.1117/12.2237239, Event: SPIE Nanoscience + Engineering, 2016, San Diego, California, United States, 10 pages.

Extended European Search Report dated May 18, 2020 in counterpart European Application No. 19217439.9 in 11 pages.

* cited by examiner

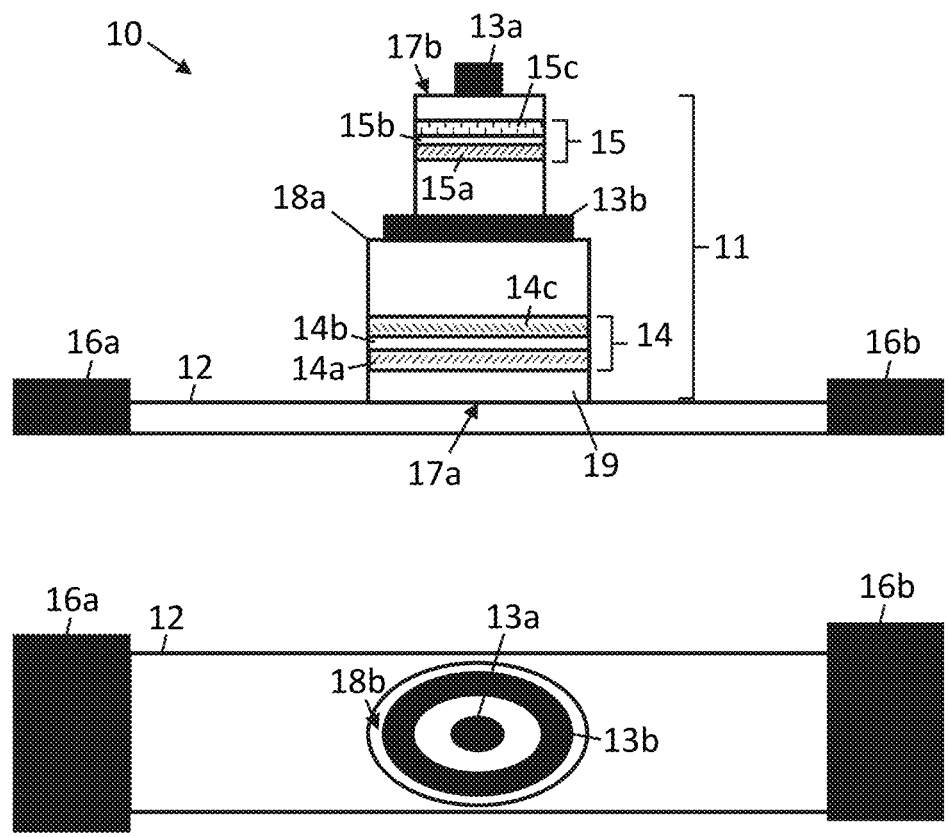
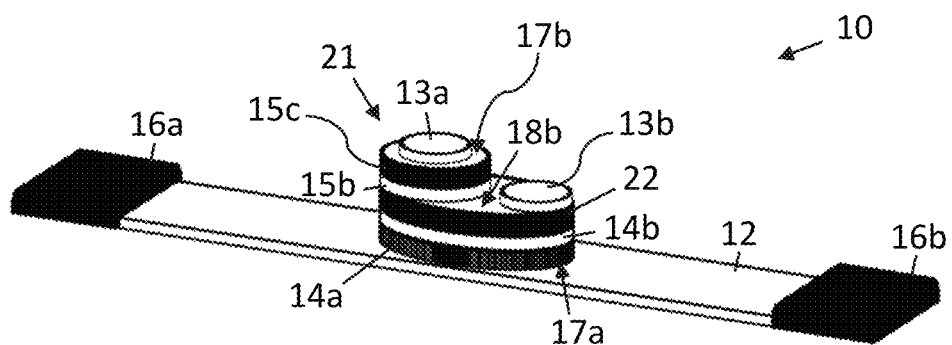
FIG 1
FIG 2

DUAL MAGNETIC TUNNEL JUNCTION STACK

CROSS-REFERENCE TO RELATED APPLICATIONS

This application claims foreign priority to European Patent Application No. EP 19217439.9, filed Dec. 18, 2019, the content of which is incorporated by reference herein in its entirety.

BACKGROUND

Field

The disclosed technology relates to the field of non-volatile magnetic memory devices, in particular to those based on spin-orbit and spin-transfer torque, and their use in magneto-resistive memory storage technology and machine learning applications.

Description of the Related Technology

International application WO 2018/136003 A1 (AGENCY FOR SCIENCE, TECHNOLOGY AND RESEARCH), 26 Jul. 2018, discloses a memory cell and an array of memory cells in which a single stack of material layers comprises first and second magnetic tunnel junctions having a common magnetic pinned layer, or two spaced apart magnetic pinned layers, and having respective magnetic free layers at opposing ends of the stack. A direction of magnetization of the magnetic free layer of the first magnetic tunnel junction is controlled by the spin-orbit torque exerted by a current flowing between the end portions of a first cell electrode, a direction of magnetization of the magnetic free layer of the second magnetic tunnel junction is controlled by the spin-orbit torque exerted by a current flowing between the end portions of a second cell electrode and a direction of magnetization of the magnetic pinned layer(s) is fixed. In a particular embodiment, the single stack of material layers further comprises a third magnetic tunnel junction between the first and the second magnetic tunnel junction and a direction of magnetization of a magnetic free layer of the third magnetic tunnel junction is controlled by spin-transfer torque exerted by a current flowing through it.

A disadvantage of the memory cell described in the document cited above is that, in contrast to the formation of a magnetic free layer of the lower, second magnetic tunnel junction on top of a spin-orbit torque material for the second cell electrode, the formation of a spin-orbit torque material for the first cell electrode on top of the magnetic free layer of the upper, first magnetic tunnel junction is very challenging, if not infeasible, to achieve with the technology available at present. The magnetic free property of this layer is easily damaged or destroyed during contact formation with the spin-orbit toque material.

SUMMARY OF CERTAIN INVENTIVE ASPECTS

It is an object of embodiments of the disclosed technology to provide a material layer stack for non-volatile magnetic memory applications capable of storing two data bits in the same stack, which does not require the formation of a spin-orbit torque material as a top electrode.

This is solved by devices and methods according to embodiments of the disclosure.

It is an advantage of embodiments of the disclosure that writing a bit to the second magnetic tunnel junction is carried out independently of the writing of another bit to the first magnetic tunnel junction.

It is an advantage of embodiments of the disclosure that reading of the two stored bits can be performed independently, in parallel or in sequence. It is an advantage of embodiments of the disclosure that reading of the two stored bits can be performed in combination to yield a Boolean function of the two stored bits.

It is a further advantage of embodiments of the disclosure that the read and write paths of the first magnetic tunnel junction can be decoupled.

In a first aspect the disclosure relates to a material layer stack for use in a non-volatile memory device. The stack is extending in a vertical direction and is delimited in this direction by a first end face at the lower end (e.g., bottom face) and a second end face at the upper end (e.g., top surface). The stack comprises a first magnetic tunnel junction and a second magnetic tunnel junction, and each magnetic tunnel junction has an associated reconfigurable magnetoresistance which is adapted for storing a bit. The first magnetic tunnel junction and the second magnetic tunnel junction are adapted for magnetic polarization switching assisted by spin-orbit torque and spin-torque transfer respectively. A first top electrode is formed on the second end face of the stack. A shoulder is formed on a lateral face of the stack, thereby dividing the stack into an upper stack portion and a lower stack portion. In other words, an upper portion of the stack and a lower portion of the stack are arranged in such a way that they join in a shoulder forming portion of the stack. A tunnel barrier of the first magnetic tunnel junction is arranged in the lower stack portion and a tunnel barrier of the second magnetic tunnel junction is arranged in the upper stack portion. A second top electrode is formed on the shoulder.

The first and the second magnetic tunnel junctions may be configured according to an in-plane magnetic anisotropy or a perpendicular magnetic anisotropy.

According to some embodiments of the disclosure, the shoulder may comprise a partially opened intermediate surface of the stack. For such embodiments the exposed portion of the intermediate surface provides a flat raised surface on which the second top electrode is formed. The upper stack portion abuts the lower stack portion on that intermediate surface. Therefore, by specifically adapting the cross-sectional shapes and areas of the upper stack portion and the lower stack portion at their respective abutting ends, as well as their relative positioning, second top electrodes of various shapes and sizes can be accommodated. As a result thereof, a better control of current-induced heating or reduced contact resistance losses can be achieved.

According to some embodiments of the disclosure, each one of a first magnetic electrode of the first magnetic tunnel junction and a second magnetic electrode of the second magnetic tunnel junction, which are facing the first end face and the second end face of the stack respectively, comprises a magnetic recording layer. A magnetic recording layer has a magnetic polarization that is switchable between two predetermined directions. Further, a second magnetic electrode of the first magnetic tunnel junction and a first magnetic electrode of the second magnetic tunnel junction are provided as a single layer magnetic electrode that is common to both magnetic tunnel junctions. This single layer magnetic electrode comprises a magnetic pinned layer with a fixed magnetic polarization direction. For such embodiments, the magnetic pinned layer of the single layer magnetic electrode acts as a reference layer for the first and second bit stored in the first and second magnetic tunnel junction respectively, whereby a unique identification and retrieval of two-bit states is achieved without requiring processing of several magnetic pinned layers of the stack. Hence, a number of magnetic layers to be processed for the manufacture of the stack is reduced.

According to further embodiments of the disclosure, a second magnetic electrode of the first magnetic tunnel junction and a first magnetic electrode of the second magnetic tunnel junction are provided as a single layer magnetic electrode that is common to both magnetic tunnel junctions. This single layer magnetic electrode comprises a magnetic recording layer with a magnetic polarization direction that is switchable between two predetermined directions. A first magnetic electrode of the first magnetic tunnel junction, which is facing the first end face of the stack, comprises another magnetic recording layer also having a magnetic polarization direction that is switchable between two predetermined directions. The second magnetic electrode of the second magnetic tunnel junction comprises a magnetic pinned layer acting as a reference layer for the second magnetic tunnel junction. For such embodiments, a logic function of the two stored bits can be detected more easily by sensing only the first magnetic tunnel junction. A layer stack according to such embodiments is thus suitable for use in a memory cell of an array of cells, in which the memory cell has Boolean logic computing capabilities.

A partially opened top surface of the single layer magnetic electrode common to both magnetic tunnel junctions may vertically delimit the shoulder. Therefore, no additional layer needs to be provided for contacting of the second top electrode.

In a further aspect the disclosure relates to a non-volatile memory device which comprises a material layer stack according to embodiments of the first aspect and a conductor with contact terminals disposed on both ends of the conductor. The conductor is electrically contacting the first end face of the stack. Preferably, the conductor and/or a non-magnetic conducting layer provided at the first end face of the stack comprises a heavy metal based material that is suitable for current-induced spin-orbit torque switching of the magnetoresistance associated with the first magnetic tunnel junction. The conductor may be provided as a thin strip on a substrate supporting the stack.

In a further aspect, the disclosure is directed to a memory structure which comprises an array of memory cells arranged in rows and columns. Each memory cell comprises a non-volatile memory device in accordance with embodiments of the previous aspect, and at least first and second electronically controlled switches for controlling write access to the memory cell. The first and the second switch are coupled to one of the contact terminals of the memory device and one of the top electrodes of the stack respectively. A plurality of bitlines of the array is organized into sets, each set of bitlines being operatively coupled to the memory cells of a same column. Likewise, a plurality of wordlines of the array is organized into sets, each set being operatively coupled to the memory cells of a same row and comprising at least first and second wordlines configured to transmit control signal to control terminals of the first or the second switches in that row. The coupling can comprise a direct electrical connection or an electronic access switch coupled between a terminal or electrode of the memory cell and a corresponding bitline. A set of bitlines comprises at least three distinct bitlines functionally and logically arranged as first and second pairs of bitlines. At least one power source adapted for supplying writing currents for switching the magnetoresistances associated with the first and the second magnetic tunnel junction of memory cells of the array is also included in the memory structure, as well as a sensing unit adapted for detecting magnetoresistance states associated with a memory cells of the array.

During writing, the at least one power source may be coupled to the first pair of bitlines of a memory cell or to first pairs of bitlines of a same row of memory cells to supply a spin-orbit torque writing current through the conductor of each row cell that is to be written when the first switch or a first pair of commonly controlled switches is open. The controlled switches in the remaining rows of the array will typically be closed.

During writing, the at least one power source may be coupled to the second pair of bitlines of a memory cell or to second pairs of bitlines of a same row of memory cells to supply a spin-transfer torque writing current through the upper, second magnetic tunnel junction of each row cell that is to be written when the second switch is open. The controlled switches in the remaining rows of the array will typically be closed.

During sensing, the sensing unit may be coupled to the first bitline of the second bitline pair of each column to sense a voltage thereof, in response to a predetermined sensing current supplied to the first bitline(s), with the remaining bitlines being grounded.

During sensing, the sensing unit may be coupled to the first bitline of the second bitline pair of each column and to both bitlines of the first bitline pair of each column to sense a voltage in respect of each bitline pair, in response to predetermined sensing currents supplied to the first bitline of the second bitline pair and to the bitlines of the first bitline pair in each column, with the remaining bitlines being grounded.

During sensing, the sensing unit may be coupled to the second bitlines of the first and second bitline pair of each column to sense a voltage swing between the second bitlines. The second bitlines of the first and second bitline pair of each column may be pre-charged to different voltage levels before sensing.

The sensing unit may comprise one or more voltage comparator units configured to receive the sensed voltage signals as inputs and to receive one or more reference voltages as further input. The sensing unit may comprise a sense amplifier unit for amplifying a sensed voltage signal.

According to some embodiments of the disclosure, the set of bitlines for each column of memory cells comprises three bitlines organized into two pairs of bitlines and one of the three bitlines is shared between the two bitline pairs. The memory cell is operatively coupled to the first pair of bitlines via a pair of first commonly controlled switches connected to each of the contact terminals of the memory device. The third bitline is connected to the first top electrode of the memory device stack and the bitline shared between the first and second pair of bitlines is operatively coupled to the second top electrode of the memory device stack via an independently controlled second switch. Implementing a bitline as a shared resource can reduce the wiring overhead and reduce the area occupied by each memory cell in the memory array.

In some other embodiments of the disclosure, the set of bitlines for each column of memory cells comprises four bitlines organized into two pairs of bitlines and none of the bitlines is a shared resource between the two bitline pairs. Then the additional fourth bitlines is operatively coupled to the second top electrode of the memory device stack via an independently controlled second switch.

According to another embodiment of the disclosure, the set of bitlines for each column of memory cells comprises four bitlines, which are functionally organized into two bitline pairs. One of the bitlines of the first pair may be operatively coupled to a first contact terminal of the memory device via the first switch, whereas the other one bitline of the first pair may be directly connected to a second contact terminal of the memory device. One bitline of the second pair of bitlines may be operatively coupled to the first top electrode of the memory device stack via the second switch and the other one bitline of the second pair may be directly connected to the second top electrode of the memory device stack.

In a further aspect the disclosure relates to a method for writing two data bits into a material layer stack of any of the embodiments of the previous aspects. The method comprises the steps of:
   supplying a first current for writing a first data bit by spin-orbit torque with polarity depending on the first data bit, and directing the supplied first current through or past the first end face of the stack adjacent to the first magnetic tunnel junction,
   supplying a second current for writing a second data bit by spin-transfer torque with polarity depending on the second data bit, and directing the supplied second current between the first top electrode and the second top electrode of the stack and through the second magnetic tunnel junction.

The first and the second current may be supplied at the same time. The two data bits can thus be written concurrently to a memory cell or a row of cells, whereby a data writing step is performed in a more speedy manner. Alternatively, the first and the second current are supplied in sequence, which has the advantage that a single power source may be used for writing. Supplying the first current, the second current, or both, may comprise applying a control signal to a control terminal of at least electronic switch for enabling or disabling a flow of the supplied current to shape a current pulse.

In yet another aspect the disclosure relates to a method for reading out two data bits stored in a material layer stack in accordance with embodiments of any of the first three aspects with the additional provision that a single layer magnetic electrode is common to both magnetic tunnel junctions of the stack and comprises a magnetic pinned layer with a fixed magnetic polarization direction. The method comprises the steps of:
   supplying a first sensing current to the first top electrode and directing the supplied sensing current through the second magnetic tunnel junction to the second top electrode,
   supplying a second sensing current to the first end face of the stack and directing the supplied sensing current through the first magnetic tunnel junction to the second top electrode,
   comparing voltage drops across the upper and the lower stack portion in response to the first and second sensing currents, respectively, to first and second reference voltages to detect a high or a low magnetoresistance configuration associated with each of the first and second magnetic tunnel junction,
   generating output signals representative of the first and second data bit stored in the stack based on the detected magnetoresistance configuration for the first and second magnetic tunnel junction.

The first and the second sensing current may be supplied at the same time. The two stored data bits can thus be read out concurrently from a memory cell or a row of cells, whereby a data reading step is performed in a more speedy manner. Alternatively, the first and the second sensing current are supplied in sequence, which has the advantage that each one of the two stored data bits can be read out independently and at different moments of time.

According to an alternative reading method, two-bit configurations of two data bits stored in a material layer stack in accordance with embodiments of any of the first three aspects with the additional provision that a single layer magnetic electrode is common to both magnetic tunnel junctions of the stack and comprises a magnetic pinned layer with a fixed magnetic polarization direction. The method comprises the steps of:
   supplying a sensing current to the first top electrode and directing the supplied sensing current through the first magnetic tunnel junction and the second magnetic tunnel junction to the first end face of the stack,
   comparing a voltage drop across the stack in response to the sensing current to a reference voltage or a set of reference voltages comprising at least first and second reference voltages to detect one of the group comprising a high, a low, and an intermediate magnetoresistance configuration associated with the stack,
   generating an output signal representative of the two-bit configuration of the two data bits stored in the stack based on the detected magnetoresistance configuration.

The two-bit configuration being read out may correspond to a number of 'high' bits or 'low' bits in a set consisting of two bits. Another two-bit configuration to be read out, and which only requires comparison of the voltage drop across the stack to a single reference voltage, may relate to an outcome of an OR/NOR Boolean function performed on the two stored bits, e.g., this two-bit configuration indicates the presence or the absence of a 'high' bit in the stored two-bit set. According to some embodiments of the disclosure, a further steps may comprise comparing a voltage drop to a third reference voltage to detect an ordering of the two bits in two-bit configurations with a single 'high' bit. This allows for a correct retrieval of the two originally stored data bits in applications where the correct ordering of the two bits is of importance. In embodiments of the disclosure in which the stack is provided as part of a memory cell in an array, the sensing current collected at the end face of the stack may be divided into two current branches of approximately half the amplitude of the collected sensing current. The current of each branch may be directed to a different one of the two bitlines of the first pair. This can advantageously reduce resistive heating effects and lower the current sinking requirements on the bitlines.

The disclosure also relates to a method for performing a Boolean XOR function on two data bits written into a material layer stack in accordance with embodiments of any of the first three aspects with the additional provision that a single layer magnetic electrode is common to both magnetic tunnel junctions of the stack and comprises a magnetic recording layer with a magnetic polarization direction that is switchable between two predetermined directions. The method comprises the steps of:
   supplying a sensing current to the second top electrode for non-perturbative probing of a magnetoresistance configuration of the first magnetic tunnel junction in the stack, and directing the supplied sensing current through the first magnetic tunnel junction to the first end face of the stack, comparing a voltage drop across the lower stack portion in response to the supplied sensing current to a reference voltage, generating an output signal indicative of the XOR function based on an outcome of the comparison.

Furthermore, an aspect of the disclosure is directed to the use of a memory structure in accordance with embodiments of the fourth aspect as a multiply-and-accumulator unit for assisting in performing machine learning applications. It is an advantage of such memory structures that they provide means to perform bitwise multiplicative operations, such as XOR or XNOR, at a memory cell level. In-memory computing offers the benefits of improved latency and reduced energy consumption.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which:

FIG. 1 shows a side elevation and a plan view of a non-volatile memory device comprising a material layer stack according to an embodiment of the disclosure.

FIG. 2 and FIG. 3 are perspective views of non-volatile memory devices comprising material layer stacks illustrating further embodiments of the disclosure.

Figure 3:
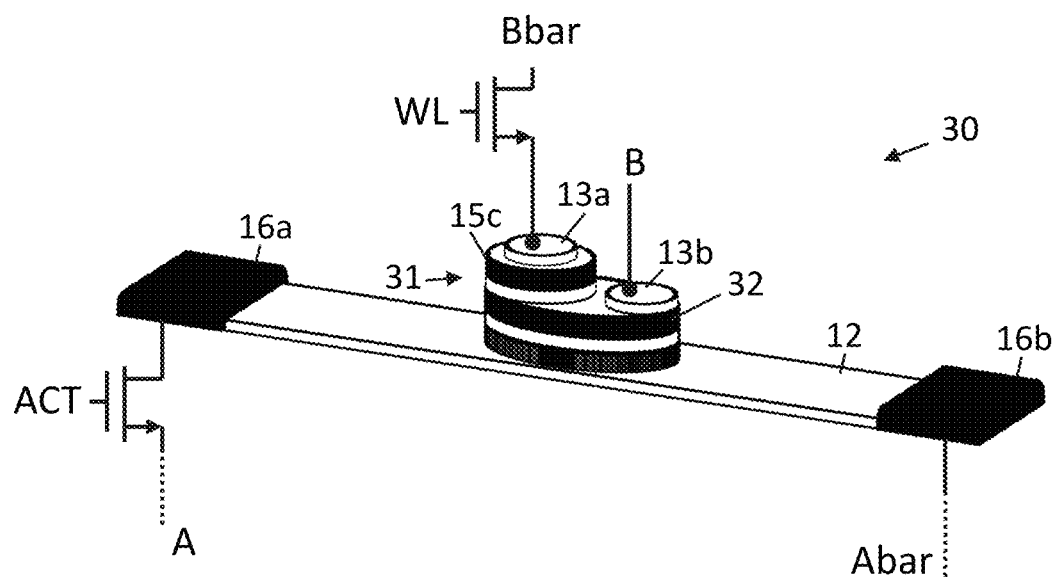

The drawings are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention. Furthermore, while some embodiments described herein include some but not other features included in other embodiments, combinations of features of different embodiments are meant to be within the scope of the invention, and form different embodiments, as would be understood by those in the art.

In the description provided herein, numerous specific details are set forth. However, it is understood that embodiments of the invention may be practiced without these specific details. In other instances, well-known methods, structures and techniques have not been shown in detail in order not to obscure an understanding of this description.

A first embodiment of the disclosed technology is described with reference to FIG. 1, which shows a material layer stack 11 and a memory device 10 in a side view in the upper part and in plan view in the lower part. The stack 11 is adapted for use in a non-volatile memory device 10 and comprises at least two magnetic tunnel junctions (MTJs) 14, 15 which are provided between a first end face 17a of the stack, e.g., the bottom face, and a second end face 17b of the stack, e.g., the top face. As part of the memory device 10, the stack 11 is formed on a conductor 12, or formed to vertically extend into or through the conductor 12. In other words, the contacted layer stack 11 forms a non-volatile memory device 10. A non-limiting example of the conductor 12 may be a conductive strip formed on or into a substrate. Both end portions of the conductor 12 may be connected to terminals 16a, 16b to allow bi-directional injection of an electrical current to flow through the conductor 12 and past the stack 11, thereby providing more convenient means for accessing the stack 11 by electrical signals. An electrical current flowing through the conductor 12 may partially, or entirely, be directed to enter a bottom layer 19 of the stack 11 at the bottom face 17a. A top electrode 13a is provided on the top face 17b of the stack 11, whereas a second top electrode 13b is provided directly on an exposed portion of an intermediate surface 18b of the stack 11. This intermediate surface 18b is only partially exposed, e.g., is left open and uncovered only over a portion thereof, and is arranged between the first end face 17a and the second end face 17b, e.g., lying parallel thereto. The exposed portion of the intermediate surface 18b thus forms a raised flat surface of a step or shoulder 18a that is disposed in a vertical direction along the stack 11 and that is suitable for the forming of a contact. In the embodiment referred to in FIG. 1, the second top electrode 13b is provided as an annular electrode extending over the entire circumference of the shoulder 18a. Having the second top electrode covering the exposed portion of the intermediate surface to a larger extent, e.g., by extending partially or fully over the circumference of the shoulder has the additional advantage that a contact resistance for the second top electrode 13b can be reduced, whereby also power dissipation in and heating of the stack are lowered. In alternative embodiments, however, the second top electrode 13b may only extend over a fraction of the circumference of the shoulder and may be of a different shape, e.g., circular, rectangular, point-like, etc.

The presence of the shoulder 18a, and associated therewith the partially opened intermediate surface 18b, effectively divides the stack into an upper stack portion and a lower stack portion. These may be independently shaped as generalized cylinders with polygonal, circular, or elliptical base; their cross-sectional area may also vary, continuously or discontinuously, in vertical direction, respectively between the first end face 17a and the intermediate surface 18b and between the intermediate surface 18b and the second end face 17b. For example, any one of the upper and lower stack portions can be formed in the shape of a conical or pyramidal frustum. Each of the two magnetic tunnel junctions (MTJs) 14, 15 is disposed in a different one of the upper and lower stack portions. For example, the first MTJ 14 is comprised by the lower stack portion and the second MTJ 15 is comprised by the upper stack portion of the stack 11. Both the first and the second MTJ 14, 15 comprise, in this order, a first magnetic electrode 14a, 15a, a non-magnetic tunnel barrier 14b, 15b, and a second magnetic electrode 14c, 15c. The first and second magnetic electrodes as well as the tunnel barriers of the MTJs 14, 15 are preferably provided as a single material layer each, but embodiments of the disclosure are not limited thereto. For example, it is possible to provide magnetic electrodes and/or tunnel barriers for the MTJs 14, 15 which are composed of two or more material layers (e.g., bilayer structures, tri-layer structures, etc.), in particular synthetic multilayered magnetic electrodes. A tunneling magnetoresistance ratio (TMR) for a MTJ is controlled by a thickness of the tunnel barrier. Preferred materials are based on MgO for the tunnel barriers and Ni for the magnetic electrodes.

In the embodiments referred to in FIG. 1, an upper surface of the second magnetic electrode 14c of the first MTJ 14 is facing away from the bottom face 17a and comprises a ferromagnetic pinned layer with a fixed magnetic polarization. In contrast thereto, a lower surface of the first magnetic electrode 14a is facing towards the bottom face 17a of the stack 11 and comprises a ferromagnetic recording layer (also referred to as magnetic free layer) a magnetic polarization of which can be switched between two predetermined directions, e.g., parallel or antiparallel to the fixed direction of magnetic polarization in the magnetic pinned layer of the second magnetic electrode 14c. The magnetic recording layer of the first magnetic electrode 14a can be formed on or adjacent to a non-magnetic conductive layer, e.g., the bottom layer 19 of the stack, e.g., a layer comprising a heavy metal such as Pt, Pd, or Ta, which is suitable for causing a spin current transverse to the direction of a (charge current) flow through the conductor 12, e.g., by the spin-Hall effect. In other embodiments of the disclosure, the conductor 12 itself comprises a portion of non-magnetic material (e.g., heavy metal) suitable for generating a spin current transverse to the charge current flow, e.g., via the spin-Hall effect. In such other embodiments, the bottom layer 19 may be omitted. Further, a lower surface of the first magnetic electrode 15a of the second MTJ 15 is facing towards the second magnetic electrode 15c and away from the top face 17b of the stack 11 and comprises a ferromagnetic pinned layer with a fixed magnetic polarization. An upper surface of the second magnetic electrode 15c of the second MTJ 15 is facing towards the top face 17b of the stack 11 and away from the first magnetic electrode 15a of the second MTJ 15 and comprises a ferromagnetic recording layer a magnetic polarization of which can be switched between two predetermined directions, e.g., parallel or antiparallel to the fixed direction of magnetic polarization in the magnetic pinned layer of the first magnetic electrode 15a. The fixed directions of magnetic polarization for the magnetic pinned layers in the two MTJs 14, 15 may be oriented parallel or antiparallel to each other.

According to some embodiments of the disclosure, the magnetic electrodes 14c, 15a of the first and second MTJ 14, 15 that are facing each other are connected by at least one non-magnetic conductive layer and this at least one non-magnetic conductive layer is partially exposed to form a flat raised surface of the shoulder 18a along the stack. In other embodiments of the disclosure, the magnetic electrodes 14c, 15a of the first and second MTJ 14, 15 are connected by an antiferromagnetic layer or layers forming a synthetic antiferromagnet.

In particular embodiments of the disclosure, an example of which is illustrated in FIG. 2, the magnetic electrodes 14c, 15a of the first and second MTJ 14, 15 are in direct physical contact such that their magnetic pinned layers form a single magnetic pinned layer 22 with a single fixed magnetic polarization. For such embodiments, less ferromagnetic layers have to be processed when forming the stack 21. Furthermore, the second top electrode 13b can be formed directly on an exposed horizontal surface of the shoulder-forming portion 18a of the single magnetic pinned layer 22. This embodiment also differs from the previous embodiment in that the horizontal surface of the shoulder-defining portion 18a of the stack 21 is not exposed in a radially symmetric way. In other words, the exposed horizontal surface of the shoulder-defining portion 18a of the stack 21 is not formed all around the stack circumference, but only over a segment thereof, e.g., substantially only on one side of the stack 21 such that there exists a specific side for contacting by the second top electrode 13b. Here, the upper stack portion of the stack 21 does not only have a smaller cross-sectional area than the lower stack portion, but this upper stack portion is also laterally offset in respect of the lower stack portion, e.g., is decentered. For such a particular embodiment, the first MTJ 14 is entirely formed in the lower stack portion, whereas the second MTJ is partially formed in the upper stack portion (second magnetic electrode 15c and tunnel barrier 15b), with the remaining part (first magnetic electrode 15a being the single magnetic pinned layer 22) being formed in the lower stack portion. Embodiments of a material layer stack 21 and related memory device 10 as referred to in FIG. 2 can be used in memory cells of a memory array structure, in which each individual memory cell is capable of storing two bits as a resistance configuration of the first MTJ and the second MTJ respectively. The single shared pinned layer 22 acts as a common magnetic reference layer for both MTJs. If used in a memory cell, a pair of access transistors, which are controllable by address signals sent over a first wordline, might be arranged at both end portions of the conductor 12 such that a first terminal of each transistor of the pair is connected to a corresponding terminal 16a, 16b and a second terminal of each transistor of the pair is connectable to bitlines of the array. Similarly, a third access transistor, which are controllable by address signals sent over a second wordline, might be arranged at the second top electrode 13b of the stack 21 such that a first terminal of the third transistor is connected to the second top electrode 13b and a second terminal of the third transistor is connectable to one of the bitlines of the array.

A further embodiment is now described with reference to FIG. 3. With regard to the layer stack 31 of this embodiment, the upper stack portion is also laterally offset with respect to the lower stack portion, similar to what has been already disclosed in relation to the embodiments of FIG. 2. However, a magnetic recording layer 32 constitutes a common magnetic electrode for the first and the second MTJ 14, 15. In other words the single magnetic recording layer 32 performs the functions of both the second magnetic electrode 14c and the first magnetic electrode 15a, where these were provided as separate layers in previous embodiments. In this embodiment, it is the second magnetic electrode 15c of the second MTJ 15 that comprises a magnetic pinned layer with a fixed magnetic polarization, whereas the common electrode 32 consists of the magnetic recording layer the magnetic polarization of which is switchable between the predetermined directions, e.g., parallel or antiparallel to the fixed direction of magnetic polarization in the magnetic pinned layer of the second magnetic electrode 15c of the second MTJ 15. Notwithstanding the permutation of the two magnetic electrodes 15a, 15c, a current flow through the second MTJ 15 is still spin-polarized by the presence of the magnetic pinned layer in the second magnetic electrode 15c of the second MTJ 15, thereby allowing switching of the magnetic polarization in the magnetic recording layer of the second MTJ 15 by spin-torque transfer (STT). As a further consequence, the first MTJ 14 is provided without a magnetic pinned layer in this embodiment. Instead, the common electrode layer 32 acts as a reference layer with regard to the magnetic recording layer of the first magnetic electrode 14a. Although the magnetic polarization of this reference layer 32 is subject to STT-induced switching, a reference direction of magnetic polarization is still well-defined with respect to the magnetic recording layer of the first magnetic electrode 14a. Therefore, spin-dependent tunneling through the first MTJ 14 is still yielding the magneto-resistive effect, e.g., the magneto-resistance value of the first MTJ 14 depends on the relative orientation between the two magnetic recording layers in the first magnetic electrode 14a and the second magnetic electrode 14c, respectively.

The non-volatile memory device 30 shown in FIG. 3 may be used as a memory cell in a memory array structure with in-memory computing capability. A memory cell based on the memory device 30 is well-suited to perform a two bit multiplicative operation between a stored bit representing a weight and a stored bit representing an input activation in the context of machine learning applications, e.g., an XOR multiplication. For example, the weight-representing bit is stored in a non-volatile manner as a magnetoresistance configuration in the second MTJ 15 and the input activation-representing bit is stored as magnetic polarization direction in the magnetic recording layer of the first magnetic electrode 14a. As a result thereof, the relative alignment of the magnetic polarization directions in the two magnetic recording layers of the two magnetic electrodes 14a, 32 of the first MTJ 14, e.g., parallel or antiparallel, can be read out, e.g., by providing a sensing current flowing from the second top electrode 13b through the first MTJ 14. The readout is indicative of an XOR function performed on the stored input activation-representing bit and the stored weight-representing bit. The non-volatile memory device 30 comprises a first controlled electronic switch having a current supplying terminal connected to the first terminal 16a of the conductor 12, and a second controlled electronic switch having a current supplying terminal connected to the first top electrode 13a. A current receiving terminal of the first and the second controlled switch are connectable to signal lines A and Bbar, respectively. Further, signal lines Abar and B are connectable to the second terminal 16b of the conductor and the second top electrode, respectively. These signal lines (A, Abar, B, Bbar) may correspond to bitlines of a memory array structure which comprises a plurality of non-volatile memory devices 30 as memory cells arranged in a plurality of rows and a plurality of columns. The first and second controlled electronic switches may be provided as bi-directional transistors, e.g., FETs, which are configured to receive control signals ACT and WL on their respective control terminals for switching the transistors on or off.

In embodiments of the disclosure, the two directions of magnetic polarization associated with the magnetic recording layers of the first MTJ 14 and the second MTJ 15 can be in-plane, e.g., are lying in the plane of the magnetic recording layer, or perpendicular, e.g., being oriented perpendicularly to the plane of the magnetic recording layer. The in-plane or perpendicular configuration can be selected, amongst others, by the magnetic crystal anisotropy (growth) and/or the shape anisotropy (geometric dimensions). A magnetic polarization direction associated with the magnetic recording layer of the first magnetic electrode 14a of the first MTJ 14 is switchable between the two predetermined directions, in a controlled way, via the spin-orbit torque (SOT)

effect. A transverse spin current is generated in response to an electrical current flowing through the conductor 12 via the spin-hall effect and is absorbed by the magnetic recording layer, where it exerts a torque on the current magnetic polarization vector. The direction of the magnetic polarization associated with the second magnetic electrode 14c (e.g., fixed direction for magnetic pinned layer, or switchable between two predetermined direction for a magnet recording layer) defines the orientation of the resulting magnetic field, which is external to the first magnetic electrode 14a and is a source of symmetry breaking in the magnetic recording layer of this first magnetic electrode 14a (e.g., breaking the symmetry for energy barriers related to opposite rotation directions for inverted spin torques). A characteristic electrical current density through the conductor 12, the SOT threshold switching current density, or the spin-torque is sufficiently strong to induce a reorientation of the magnetic polarization of the magnetic recording layer. An additional magnetic layer comprised by the stack may reenter the SOT threshold currents symmetrically about zero current. Hence, reversal of the current polarity allows switching back of the magnetic polarization of the magnetic recording layer of the first magnetic electrode 14a of the first MTJ 14 back to the initial direction. Further, a direction of the magnetic polarization associated with the magnetic recording layer of the second MTJ 15 is switchable in a controlled way, via the spin-transfer torque (STT) effect, also between two predetermined directions. An electrical current injected into the stack at the first top electrode 13a and directed towards the second top electrode 13b is spin-polarized upon transmission or reflection by the magnetic pinned layer of the second MTJ, depending on the polarity of the current flowing. In consequence, a spin-polarized electrical current is tunneling into the magnetic recording layer of the second MTJ 15, where it is exerting a torque on the magnetic polarization. Exceeding a threshold value, the electrical current effectively switches the magnetic polarization of the magnetic recording layer of the second MTJ 15 into the parallel or antiparallel configuration relative to the fixed magnetic polarization direction in the magnetic pinned layer of the second MTJ 15. Providing an electrical current flowing through the conductor 12 and past the stack is achieved independently of another electrical current flowing through the stack, whereby the writing mechanism of the two magnetic free layers 14a, 15a is decoupled. This allows for better endurance, less power dissipation and better read margins.

Figure 5:
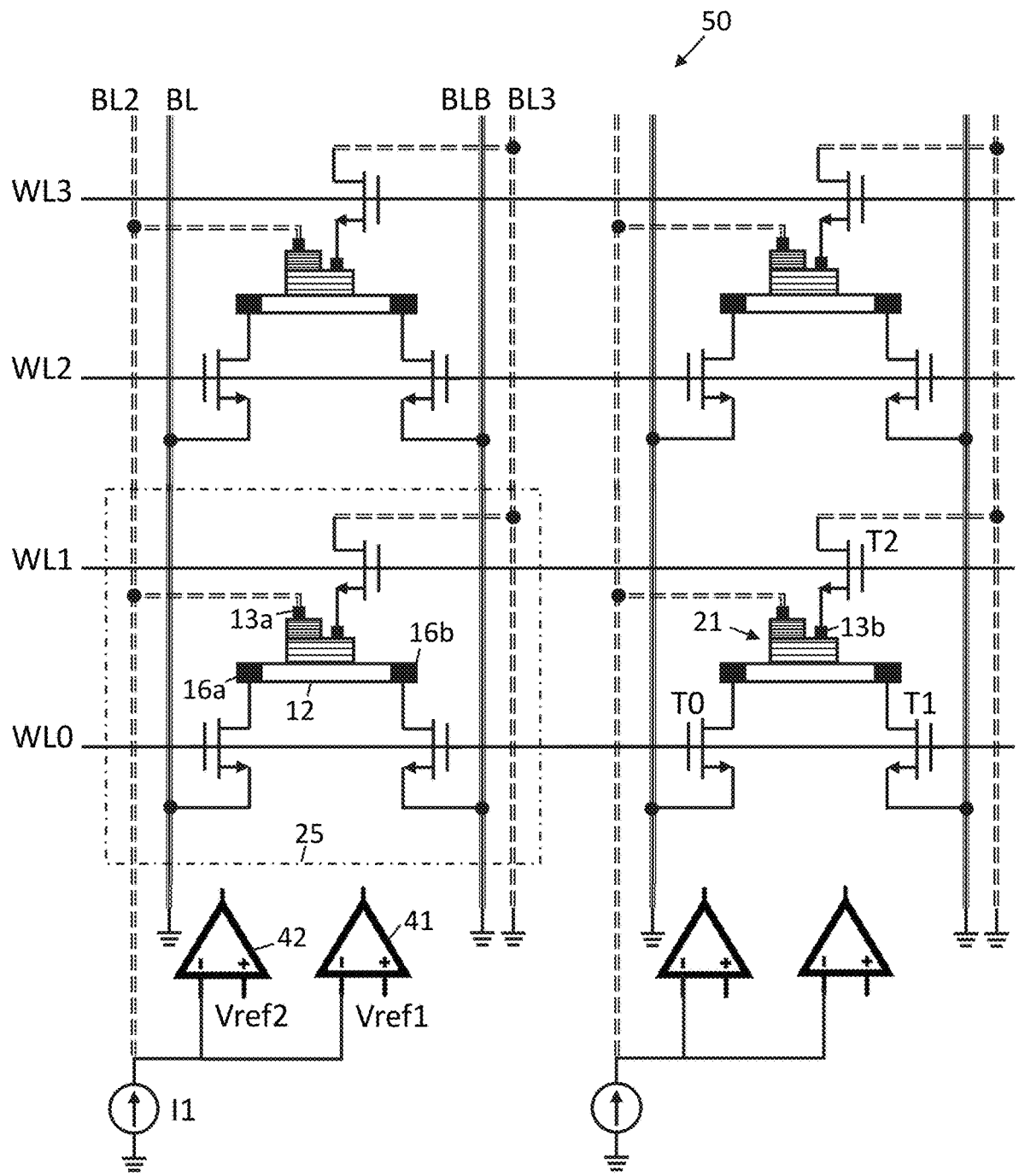
FIGS. 5 to 7 show two variants of arrayed memory structures comprising a plurality of non-volatile memory devices according to embodiments of the disclosure, with respect to which performing methods of writing two bits and of reading out information relating to the two written bits in accordance with embodiments of the disclosure are explained.
Figure 6:
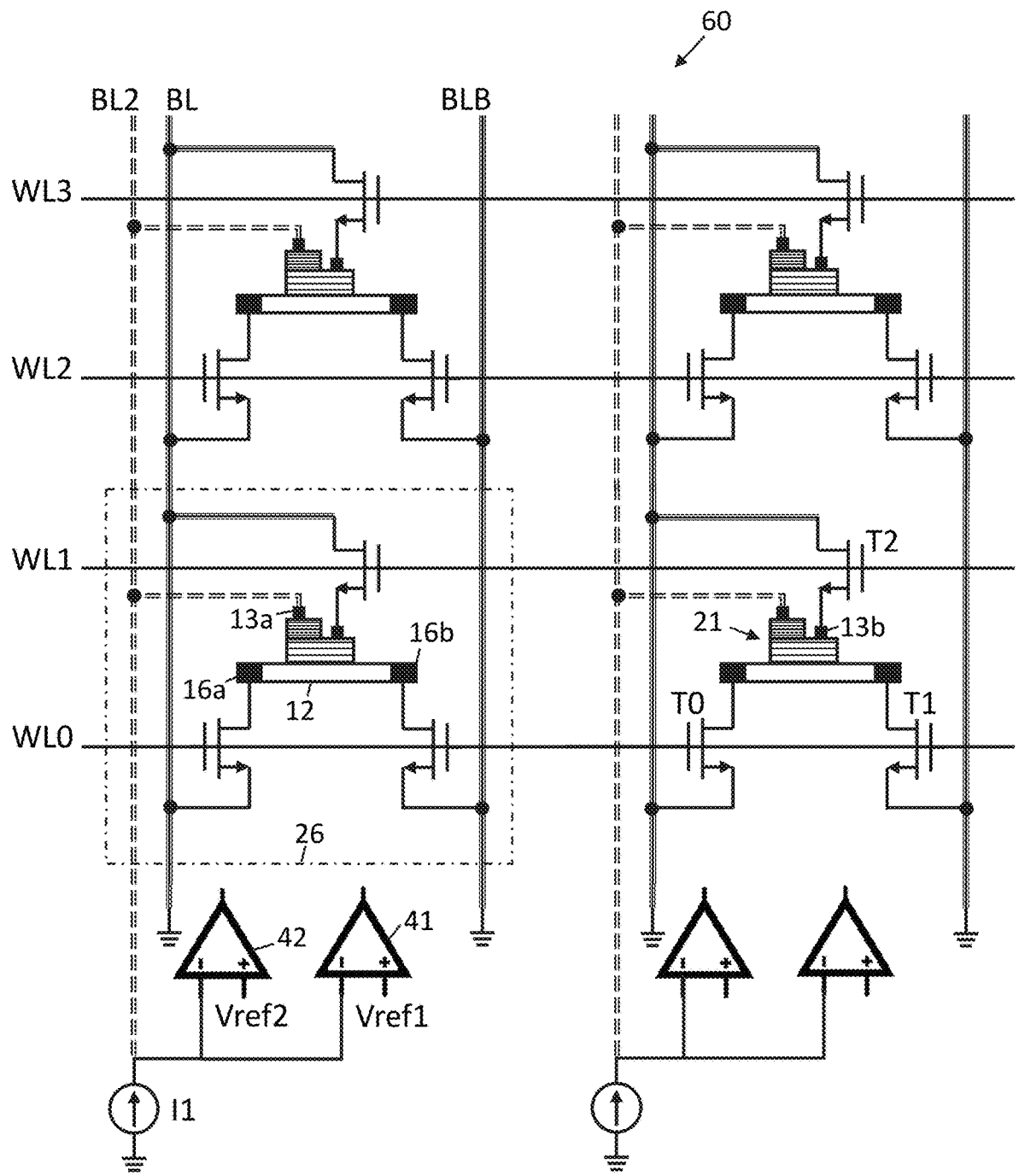

In the following, a method for writing bits into a memory cell and a method for reading out information relating to the two written bits from a memory cell are described with reference to the embodiments referred to in FIG. 1 and FIG. 2. This is further exemplified in FIG. 5, in which an array configuration of a plurality of memory cells 25 is outlined (only 4 cells are drawn for the sake of clarity), i.e. a non-volatile memory array structure 50. The memory cells 25 of the memory array 50 are arranged in rows and columns. Memory cells of a same column are connected to a first pair of bitlines (e.g., BL and BLB), and further to a second pair of bitlines (e.g., BL2 and BL3), whereas memory cells of a same column are connected to first and second wordlines (e.g., WL0 and WL1). Bitlines may be shared, if possible, to reduce the wiring area overhead, whereby the area occupied by each memory cell in the array structure may be reduced accordingly and denser integration can be achieved. A non-volatile memory array structure 60 implementing the sharing of bitlines is illustrated in FIG. 6, which differs from the embodiment relating to FIG. 5 in that each one of a plurality of memory cells 26 is operatively coupled to three bitlines only. A first pair of bitlines BL, BLB is then provided as in FIG. 5, whereas the previous fourth bitline BL3 of the second pair of bitlines BL2, BL3 has been omitted. The second pair of bitlines is formed by the bitlines BL2 and BL instead, and the first bitlines BL pf the first bitline pair is implemented as a shared bitline. This advantageously of reduces the total number of bitlines per column of the memory array structure from four to three.

Referring back to FIG. 5, each memory cell 25 comprises a stack 21, which is suitable for permanently storing two bits as a combination of resistance states for the first MTJ and the second MTJ of the stack. Furthermore, each memory cell 25 includes three electronic switches, e.g., transistors (e.g., bi-directional FETs), two of which (e.g., the transistor pair T0 and T1) are connected between bitlines of the first pair of bitlines and terminals of the conductor 12 supporting and contacting the stack 21. The electronic switches are subject to control signals which determine an operating condition of the switch, e.g., a conducting "on" state and a substantially non-conducting "off" state. For instance, a first transistor T0 is connected between a first bitline BL of the first pair of bitlines and a first terminal 16a of the conductor 12, and a second transistor T1 is connected between a second bitline BLB of the first pair of bitlines and a second terminal 16b of the conductor 12. A control terminal of the transistors T0, T1 is connected to the same (first) wordline WL0. The first top electrode 13a of the stack 21 is connected to a first bitline BL2 of the second pair of bitlines, and the third electronic switch, e.g., a transistor T2, is connected between the second top electrode 13b of the stack 21 and a second bitline BL3 of the second pair of bitlines. The control terminal of the third transistor T2 is connected to the (second) wordline WL1.

A power source (not shown) is operatively connectable to the first pair of bitlines BL, BLB. For example, a voltage source may be operatively coupled to the bitlines of the first pair of bitlines to establish a voltage difference therebetween. Alternatively, a pre-charging circuit may be provided to independently pre-charge each one of the pair of first bitlines to a predetermined voltage level, e.g., Vss or Vdd, or a current source may be operatively connected between the bitlines of the first pair of bitlines to inject and maintain a (constant) current flow from the first bitline BL towards the second bitline BLB of the first pair of bitlines, or vice versa, assuming a current path between the bitlines BL and BLB exists (e.g., through one of the memory cells in the column). The current source may be a current source with polarity-reversing capability or may comprise two current generating units of different polarity, being selectable one at a time. The foregoing details regarding a power source are also applicable to the second pair of bitlines BL2, BL3. For the exemplary memory array 50 in FIG. 5, a current source is provided for each column of the array, e.g., a first current source I1 with respect to the first column of the array, and so on, and each current source is operatively connectable between the first bitline BL2 of the second pair of bitlines and ground, the second bitline BL3 of the second pair of bitlines also being connected to ground. As explained further below, these current sources may also be used for a multibit reading operation carried out for memory cells of the array. It is within the capabilities of the skilled person, however, to provide for a separate multibit reading circuitry if this proves to be more adequate.

For writing of a first bit into the memory cell, e.g., a logical zero or a logical one, a control signal is applied to the first wordline connected to this cell, e.g., to wordline WL0, to switch the two transistors T0, T1 into the conducting state (e.g., into saturation mode), whereby a current path is established between the bitlines BL and BLB of the first pair of bitlines and along the conductor 12 of the memory cell to which the first bit is to be written. No control signal is applied to the remaining wordlines such that the memory cells of different rows of the array are not addressed and the third transistors T2 for the memory cells of the same row are switched off. In practice, a plurality of first bits will be written concurrently to the plurality of memory cells of a same row addressed. Hereinafter, the writing of bits is described only in respect of a single memory cell of an addressed row, but the skilled person does not face any difficulties in performing writing of multiple first bits to the memory cells of a same addressed row; this is a mere juxtaposition of the following steps carried out in parallel or in a series of steps (time-multiplexing) for each memory cell of the same addressed row.

Next, a power source, e.g., a current source, is connected between the bitlines of the first pair of bitlines BL, BLB and configured to provide an electrical current, or current pulse, with magnitude larger than, or equal to, an SOT threshold current associated with the memory cell. This SOT threshold current is determined by the SOT threshold current density and the conductor/stack geometry and its value can be pre-characterized by measurement or estimated from design parameters. Preferably, the magnitude of the electrical current, or current pulse, is selected to be slightly larger than the SOT threshold current to account for an error margin related to, amongst others, array non-uniformity, local degradations by aging or repeated write cycles, and temperature variations. The polarity of the electrical current, or current pulse, delivered by the power source is selected based on the specific first bit to be written, e.g., a positive polarity "+" is selected for writing a logic high or "1", whereas a negative polarity "−" is selected for writing a logic low or "0". Any power source connectable to the second pair of bitlines is turned off or decoupled, and/or the bitlines of the second pair of bitlines are configured into a high-Z (high impedance) state. Hence, a direction of current flow through the conductor 12 of the memory cell is determined by the first bit that is written and no current flow across the MTJs of the stack 21 is allowed. As already indicated, the current may be provided over a short period of time only, e.g., as a current pulse, which lasts for a switching time period that is sufficient to induce the magnetic realignment of the magnetic recording layer that is part of the first MTJ 14. This may be achieved by the power source itself which may be provided with a pulse mode or, alternatively, by using the pair of transistors T0, T1, which may be switched on and off in a time-controlled manner to generate a brief current pulse. By means of the SOT effect and the selected polarity for the current flow through the conductor and past the magnetic recording layer of the first MTJ 14, the first bit is written or rewritten to the memory cell. More specifically, the first bit is encoded as the magnetic configuration of the first MTJ 14 in the stack 21 and is detectable by virtue of its associated magnetoresistance value upon sensing. After writing of the first bit to the memory cell, the pair of transistors T0, T1 can be switched off again; no subsequent verification step of the written first bit is needed.

For writing of a second bit into the memory cell, e.g., a logical zero or a logical one, a control signal is applied to the second wordline connected to this cell, e.g., to wordline WL1, to switch the third transistor T2 into the conducting state (e.g., into saturation mode). As a result thereof, a current path is established between the bitlines BL2 and BL3 of the second pair of bitlines, which also extends through the first top electrode 13a, the second MTJ 15 of the stack 21, and the second top electrode 13b. However, no control signal is being applied to the remaining wordlines such that the memory cells of different rows of the array are not addressed and the pair of transistors T0, T1 for the memory cells of the same row are switched off. This prevents the current from flowing through the first MTJ 14 of the stack 21 and towards either one or both of the bitlines BL, BLB of the first pair of bitlines. Additionally, the bitlines of the first pair of bitlines BL, BLB may be configured into a high-impedance state and/or a connectable power source is turned off or decoupled in respect to these bitlines BL, BLB.

Next, a power source, e.g., a current source, is connected between the bitlines of the second pair of bitlines BL2, BL3 and configured to provide an electrical current, or current pulse, with magnitude larger than, or equal to, an STT threshold current associated with the memory cell. A same power source may be shared between the first and the second pair of bitlines or separate power sources may be provided individually for each pair of bitlines. Similar to the SOT threshold current, the STT threshold current is determined by the STT threshold current density and the conductor/stack geometry; its value can be pre-characterized by measurement or estimated from design parameters. Likewise, the magnitude of the electrical current, or current pulse, is selected to be slightly larger than the STT threshold current to account for an error margin related to effects already mentioned. The polarity of the electrical current, or current pulse, delivered by the power source is selected based on the specific second bit to be written, e.g., a positive polarity "+" is selected for writing a logic high or "1", whereas a negative polarity "−" is selected for writing a logic low or "0". Hence, a direction of current flow through the second MTJ 15 of the stack 21 is determined by the second bit that is written. Also for step of writing the second bit, the current may be provided over a short period of time only, e.g., as a current pulse, which lasts for a switching time period that is sufficient to induce the magnetic realignment of the magnetic recording layer that is part of the second MTJ 15. For example, the power source may be used in a pulse mode or, alternatively, by the third transistors T2 may be switched on and off in a time-controlled manner to generate a brief current pulse. By virtue of the STT effect and the selected polarity for the current flow through the second MTJ 15, the second bit is written or rewritten to the memory cell. More specifically, the second bit is encoded as the magnetic configuration of the second MTJ 15 in the stack 21 and is detectable by virtue of its associated magnetoresistance value upon sensing. After writing of the second bit to the memory cell, the transistor T2 can be switched off again; no subsequent verification step of the written second bit is needed.

It is an advantage of the method of writing bits to the memory cells of the array that the first and the second bit are written independently. Therefore, a careful control of a magnitude of two successive current pulses is not a requirement for this method to properly work; none of the magnetic recording layers requires an additional rewriting step following a stronger preceding writing step for writing into a first one of the magnetic recording layers, but also simultaneously overwriting the other one of the magnetic recording layers. The writing currents for writing of the first and second bit can be controlled and adjusted in an independent manner, e.g., can be optimized for power consumption and/or avoidance of accidental perturbative switching, e.g., due to thermal effects, associated Oersted fields, etc. The source degeneration of FETs used as bi-directional transistors can be handled by asymmetric positive and negative threshold currents for the SOT and STT-based switching of the magnetic polarization in the magnetic recording layers. In embodiments of the disclosure, independent writing of the first and second bit does not exclude simultaneous writing of the two bits as an alternative to sequential writing. A disturbance of the larger SOT writing current by a much smaller leakage current through the lower MTJ due to the STT writing current flowing through the upper MTJ, for example during simultaneous writing of the first and second bit, is insignificant. However, such an insignificant leakage current may still assist the SOT writing mechanisms related to the lower, first MTJ by heating, provided the stability of the first bit written by the SOT mechanism is not put at risk.

Information relating to a particular stored two-bit configuration, e.g., each individual bit of the two written bits stored as a magnetoresistance configurations of the first MTJ 14 and the second MTJ 15 of the memory cell stack 21, respectively, or a logic combination derived therefrom (e.g., the number of "high" bits), can be read out by following the steps of a readout method. According to this readout method, a sensing signal is applied to the first top electrode 13a of the stack 21. This sensing signal may be a clamped voltage signal or a readout current. The latter is illustrated in FIG. 5, where a current source I1 is connected to the first top electrode 13a of the memory cell stack via the first bitline BL2 of the second pair of bitlines and is supplying the readout current. During the multibit reading, control signals are applied to the control terminals of the first and second transistor T0, T1 of the memory cell that is being read, e.g., as a common control signal transmitted on the first wordline WL0, to switch them into the conducting state. The third transistor T2 remains in the non-conducting state and prevents the readout current from flowing through the second top electrode 13b and towards the second bitline BL3 of the second pair of bitlines. Instead, the readout current is directed through the entire stack 21, traversing both the first and the second MTJ 14, 15, before it is split into two smaller readout current branches transmitted by each one of the first and second transistor T0, T1 to the first bitline BL and the second bitline BLB of the first pair of bitlines, respectively. The overall readout current path is closed, for example, by connecting the bitlines BL, BLB of the first pair of bitlines at one of their respective ends to ground. In a nearly symmetrical transistor and bitline design, the two readout current branches will be approximately equal. By directing the readout current through both MTJs 14, 15 of the stack 21, the voltage drop over the stack corresponds to a combination of resistances predominantly defined by the resistance configurations (parallel, antiparallel) of the two MTJs. This voltage drop can be measured by a voltage-sensitive sensing circuit that is in electrical communication with an output of the current source I1 or the first bitline BL2 of the second pair of bitlines at least during the time of performing the multibit reading method. In embodiments of the disclosure, the sensing circuit may be provided as, or include, a voltage comparator block, e.g., as a voltage comparator block comprising two voltage comparator units 41, 42 as shown in FIG. 5. For instance, the inverting input connector of each comparator unit 41, 42 is connected to the first bitline BL2 of the second pair of bitlines for receiving the voltage level thereof as an input, whereas the non-inverting input connector of each comparator unit 41, 42 is supplied with a respective reference voltage as a further input. For a predetermined readout current, the four resistance configurations of the memory cell stack are characterizable as four distinct voltage drops across the stack of the memory cell.

Figure 4:
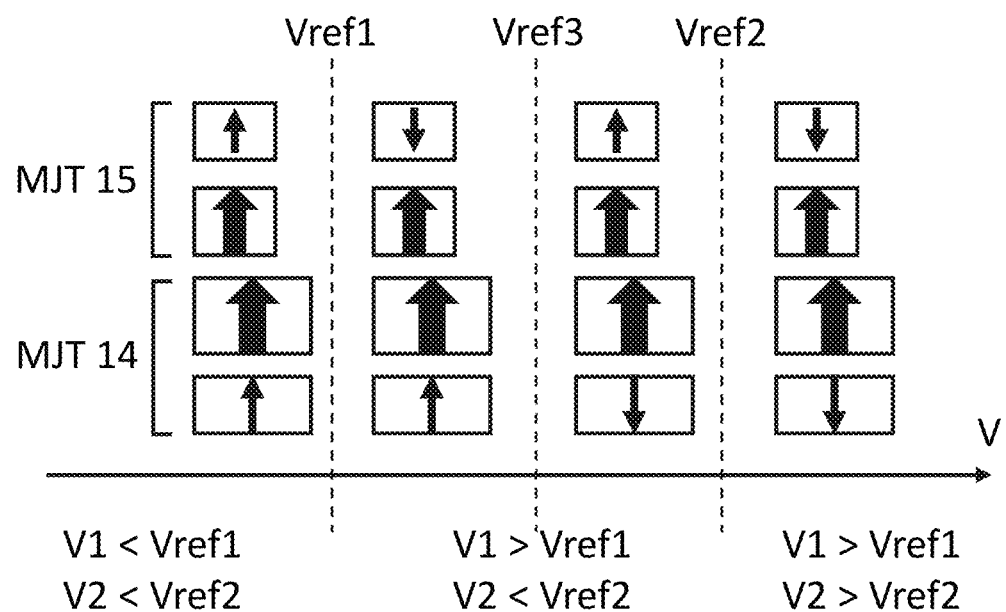
FIG. 4 illustrates magnetoresistance configurations and related voltage drops obtainable for material layer stacks in accordance with embodiments of the disclosure.

This is visualized in FIG. 4 for MTJs 14, 15 with perpendicular magnetic anisotropy, in which the voltage drops, from the smallest to the largest in this order, are associated with the parallel-parallel (P-P), parallel-antiparallel (P-AP), antiparallel-parallel (AP-P), and antiparallel-antiparallel (AP-AP) alignment of the programmable magnetic polarization in the magnetic recording layer with respect to the corresponding magnetic pinned layer for each of the pair of MTJs (first MTJ 14; second MTJ 15). In applications, in which the bit ordering of the two stored bits is irrelevant, e.g., if two-bit encoding is used for representing three symbols {S1; S2; S3} in a permutation-invariant manner, e.g., with symbol representation S1={"00"}, S2={"01"; "10" }, and S3={"11"}, comparing the voltage drop to two reference voltages, Vref1 and Vref2, is sufficient to identify the three different magneto-resistive regions, e.g., low, intermediate, high, corresponding to the symbols S1 to S3. It is possible to design the two MTJs 14, 15 to have nearly corresponding resistance values based on the cross-sectional geometry and thicknesses of each layer in the MTJ as well as the layer material. By such a design choice, the voltage drops obtained for the antiparallel-parallel (AP-P) and the parallel-antiparallel (P-AP) configuration are almost equal, whereby a single intermediate resistance region is effectively created between the region of low resistance and the region of high resistance. If on the contrary the bit ordering matters and all four two-bit combinations are to be distinguished by the readout method, a third comparator unit supplied with a third reference voltage (cf. Vref3 in FIG. 4) may be used to further discriminate between the two possible permutations of the one-high bit-one-low bit case (e.g., between the AP-P and P-AP configurations). This discrimination is preferable made more detectable by not only designing the MTJs of the stack to have a good respective magneto-resistance ratio, $R_{AP1}/R_{PP1} \gg 1$ and $R_{AP2}/R_{PP2} \gg 1$, but also to be different in their absolute resistance values, e.g., by further demanding $R_{AP2}/R_{AP1} \gg 1$. Again, the layer thicknesses, materials and geometric configuration of the two MTJs may be selected to satisfy this additional requirement.

It is noted that the magnetic polarizations of the magnetic pinned layers in the two MTJs 14, 15 may be arranged in a parallel configuration, for example, to reduce an additional resistance contribution due to spin-dependent transmission, or may be arranged in an antiparallel configuration, for example, to reduce the overall demagnetization field due to the two magnetic pinned layers. Moreover, a single magnetic pinned layer may be provided according to the parallel configuration and this single magnetic pinned layer is shared by both MTJs 14, 15, similarly to what has been disclosed in relation to the embodiment of FIG. 2.

Figure 7:
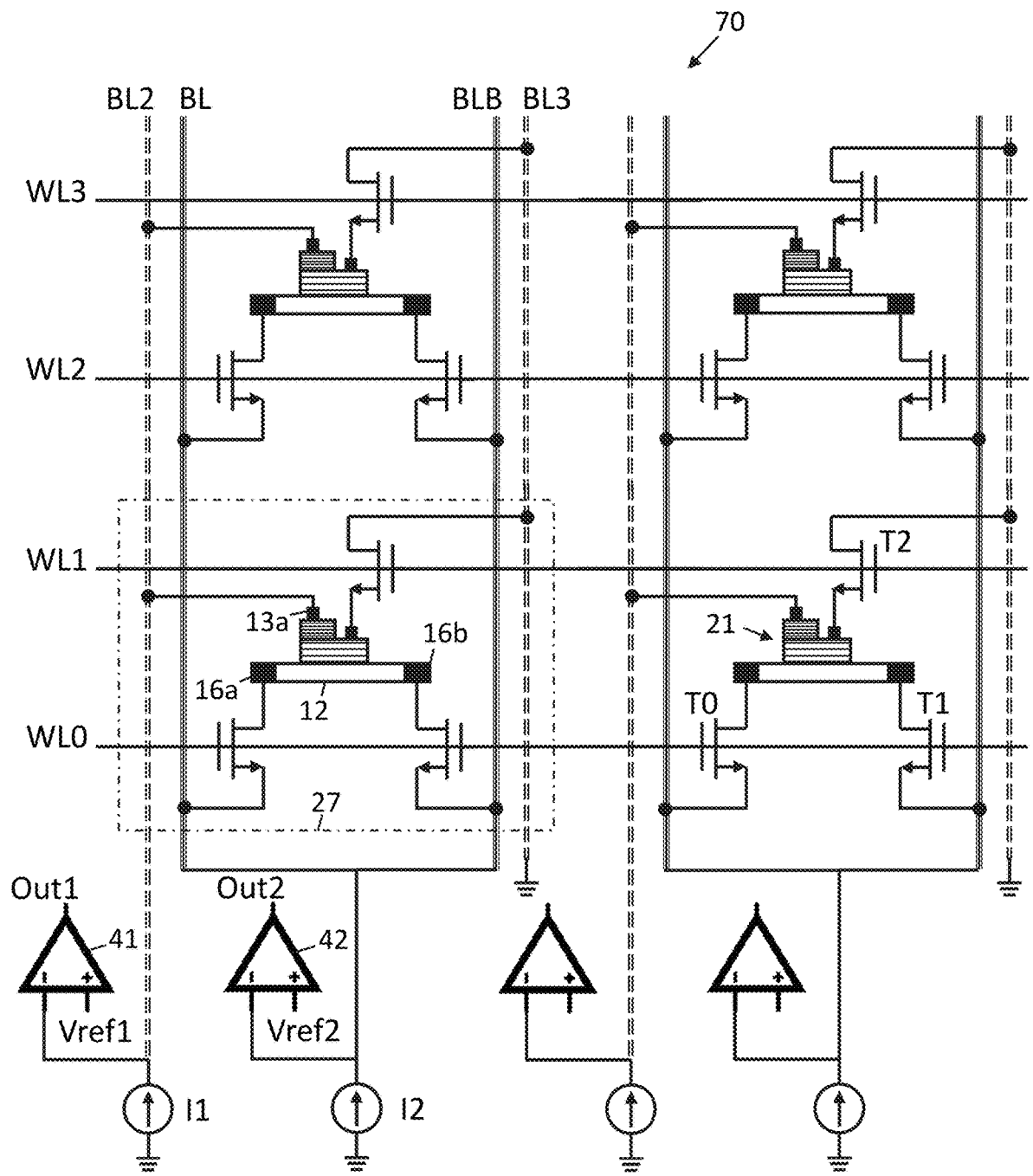

An alternative readout method is briefly described with reference to the memory array structure 70 shown in FIG. 7. This alternative readout method differs from the previous one in that two independent power sources, e.g., the two independent current sources I1 and I2, are operatively coupled to the bitlines of the memory cell 27 that is to be read out. By way of example, a first current source I1 is connected to the first bitline BL2 of the second pair of bitlines to supply a first sensing current to first top electrode 13a of the stack 21, whereas a second current source I2 is connected to both bitlines BL and BLB of the first pair of bitlines to supply a second sensing current to each of the terminals 16a, 16b at the respective ends of the conductor 12. For identically designed bitlines BL, BLB, and transistors T0 and T1, the second sensing current supplied to each terminal 16a, 16b is approximately equal and amounts to half of the sensing current supplied by the output of the second current source I2. During readout, control signals are applied to both the first wordline WL0 and the second wordline WL1 to switch all three transistors T0, T1 and T2 into the conducting state (e.g., applying a voltage signal Vdd), and the second bitline BL3 of the second pair of bitlines is grounded. As described earlier, there may be the option to provide shared bitlines for each column of the memory array structure; in embodiments relating to FIG. 7 for example, the second bitline BL3 of the second pair of bitlines can be shared with the first bitline BL of the first pair of bitlines, which reduces the total number of bitlines per column of the memory array structure to three. Memory cells belonging to different rows of the array are not addressed by control signals on their respective wordlines (e.g., these remaining wordlines are held at default voltages Vss). As a result the two branches of second sensing current are recombined into a single second sensing current when entering the stack 21 from the bottom end face 17a and traversing the first MTJ 14. The second sensing current exits the stack 21 via the second top electrode 13b and is directed through the third transistor T2 towards the second bitline BL3 of the second pair of bitlines held at ground potential. A voltage drop across the first MTJ 14 of the stack 21 can be detected on the connected (i.e. equal potential) bitlines BL, BLB of the first pair of bitlines, e.g., by a voltage sensing means, and is proportional to the resistance configuration of the first MTJ 14, e.g., dependent on whether a first written bit equals a logical "0" or a logical "1". In FIG. 7, a voltage sensing means is provided by a second comparator unit 42 to compare the detected voltage drop across the first MTJ 14 to a reference voltage signal Vref2, e.g., to provide an output OUT2 indicative of a high resistance or a low resistance state for the first MTJ 14. Besides, a current path for the first sensing current extends from the first top electrode 13a through the second MTJ 15 and to the second top electrode 13b, before being directed to the second bitline BL3 of the second pair of bitlines via the third transistor T2. Therefore, a voltage sensing means connected to the first bitline BL2 of the second pair of bitlines will be able to detect a voltage drop across the second MTJ 15 of the stack 21, which is proportional to the resistance configuration of the second MTJ 15, e.g., dependent on whether a second written bit equals a logical "0" or a logical "1". The voltage sensing means may be provided as a first comparator unit 41 to compare the detected voltage drop across the second MTJ 15 to a reference voltage signal Vref1, e.g., to provide an output OUT1 indicative of a high resistance or a low resistance state for the second MTJ 15. Voltage drops across the first MTJ 14 and the second MTJ 15 of the memory cell 27 that is being read out may be detected concurrently or sequentially.

It is an advantage of providing to independent power sources for sensing of resistance configurations in respect of the first and the second MTJ 14, 15 of the memory cell stack 21, because the current magnitudes of the first and second sensing currents can be set according to the expected or measured resistance values of the corresponding MTJ in the stack 21. This allows for smaller sensing currents being used and lower power being dissipated during readout. Furthermore, the risk of readout induced switching of the magnetic polarization in one of the magnetic recording layers of the stack 21 can be reduced. In general, the power source(s) is adapted for generating a small readout current with magnitude much less than any one of the SOT and STT threshold currents associated with the memory cell, e.g., less than about 150 microampere for the SOT threshold current and about 100 microampere for the STT threshold current. Resistances of several kilo-Ohm up to a few Mega-Ohm can be realized with MTJs, which therefore enable reduced readout currents and related power consumption.

In the preceding description of writing of bits to a memory cell of the array and for reading out information that is derivable from a particular two-bit configuration which has been written, the control signals to the first wordlines (WL0, WL2, etc.) of each row of the array may, in the context of machine learning applications, be representative of activations. For example, a binary activation signal may be applied with respect to the first wordline of each row of the memory array to selectively switch on or off the transistors T0 and T1 to respectively allow and prevent a sensing current flowing at least through the first MTJ 14 of the stack 21. The power source generating the sensing current may, in this case, be a clamped voltage source, and the sensing currents with respect to each memory cell of a same column may then be collected on a same (grounded) bitline. Hence, detection of the total collected sensing current on this same bitline, e.g., via a current sensing block, is indicative of a weighted sum, in which weights are stored in a non-volatile fashion as resistance configurations in the memory cells of the array and the weighted inputs are provided as activations on the first wordlines. This allows for the implementation of a memory array which is suitable for carrying out layer-to-layer mappings that are ubiquitous in artificial neural networks and other machine learning applications. Moreover, the activations does not have to be binary signals but may time-dependent signals, e.g., pulse-width modulated signals, which are useful to represent higher precision activation levels. The sensing currents collected in response thereto on a same bitline are then integrated over at least one period of the modulated signal, e.g., via a charge amplifier.

Figure 8:
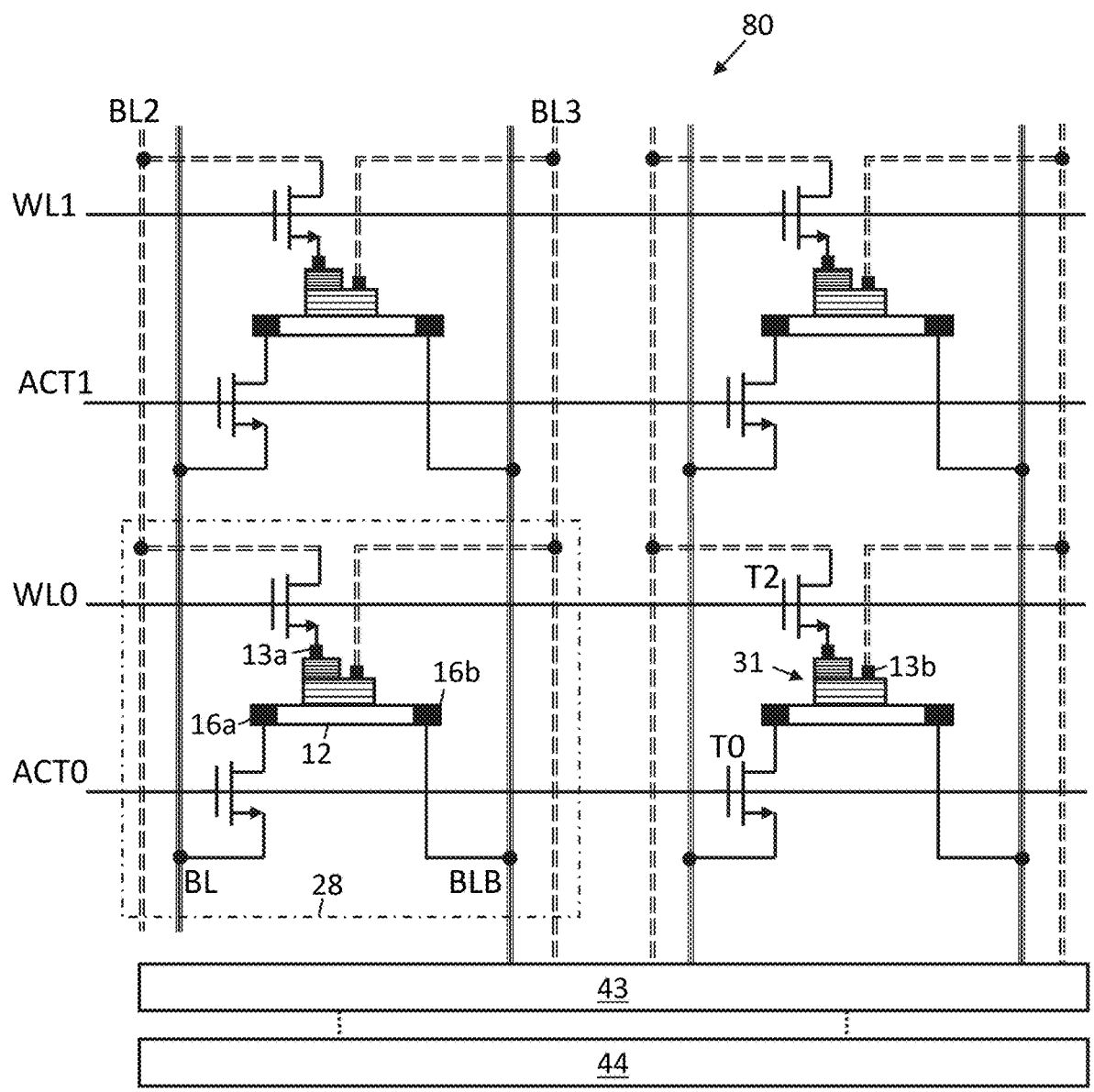
FIG. 8 shows an arrayed memory structure comprising a plurality of non-volatile memory devices according to embodiments of the disclosure, the memory structure being capable of performing multiply-and-accumulate operations, for instance in machine learning applications.

A memory array structure 80 may also include a plurality of memory cells which are based on the non-volatile memory device described in relation to FIG. 3. This is illustrated schematically in FIG. 8. With the first transistors T0 of a memory cell 28 being put into a conducting state by applying a control signal ACT0 to its control terminal, a first switching current, the SOT writing current, can be caused to flow through the conductor 12 and past the stack 31 by applying a different potential to each of the operatively connected signal lines BL and BLB, e.g., by complementary pre-charging (e.g., Vdd and Vss) two bitlines BL and BLB, the potential difference being determined as a function of the SOT threshold current. Alternatively, the SOT writing current can be directly supplied to one of the bitlines BL, BLB. The first transistors T0 of the other memory cells in the same column of the array 80 are generally required to be set into the off state to avoid cross-talk. A leakage current through the second MJT 15 is typically negligible, in particular when the second transistor T2 is in a closed (e.g., nonconducting) state during writing with the first switching current. Likewise, a second switching current, the STT writing current, can be caused to flow from the first top electrode 13a towards the second top electrode 13b and through the second MTJ 15 by directly impressing the STT writing current onto one of the bitlines BL2, BL3, or by applying a different potential to each of the operatively connected signal lines BL2 and BL3 if the second transistor T2 is conducting (e.g., by applying a control signal WL0 to the control terminal) and if the potential difference is determined as a function of the STT threshold current. Again, a leakage current through the first MTJ 14 will be negligible in such a case and the first transistor T0 is closed. The polarity of the first and second switching current is determined by the first and the second bit that is written into the non-volatile memory device. In this embodiment, the writing of two bits to a memory cell 28 of the array 80 by SOT and STT writing currents is typically performed one at a time, e.g., one following the other, e.g., first writing to the upper MJT 15 via STT and subsequently writing to the lower MTJ 14 by SOT. These sequential writing steps are not limited to follow one another immediately, but can be separated by a time period of variable length. To avoid or reduce a leakage current through the stacks of the non-addressed memory cells in the same column as the memory cell 28 that is to be written, the fourth bitline BL3 and the second bitline BLB can be configured into a high-impedance state (high-Z) for writing by the SOT and STT writing currents respectively. The floating fourth or second bitline is then drawn to the same potential as the non-floating active bitline carrying the writing current so that leakage currents in the non-addressed cells of the column are suppressed. Instead of having the fourth bitline BL3 or second bitline BLB floating, it is also possible to apply the same voltage level to both bitlines BL3 and BLB to prevent leakage currents from flowing through the stacks of non-addressed memory cells in the same column as the memory cell that is to be written. For a standalone memory device, e.g., not implanted as a cell of a memory array, providing the transistors T0, T2 is not mandatory. In a standalone memory device, for independent data lines B, Bbar, A, Abar are provided to enable the independent writing of the two data bits. Configuring a data line of each pair into a high-Z state has a similar effect as switching off a connected transistor. In embodiments of the disclosure, a single memory cell 28 of a row of cells can be written at a time in a time-multiplexed manner, or more than one memory cell 28 of a same row can be written in parallel.

It is particularly useful for in-memory computing to implement a memory cell of a memory array structure which is based on the non-volatile memory device 30, because a readout method can be performed on this device that produces an output value that equals the XOR-logic function of the first and second written bit, e.g., the non-volatile memory device 30 with stack 31 can act as a logic gate. This readout is achieved by supplying a sensing current on the signal line BL3 to the second top electrode 13b and directing the sensing current through the common electrode 32 and the first MTJ 14 towards the signal line BLB. A corresponding current path is established, for example, by switching the two transistors T0 and T2 off and by maintaining a voltage difference, or providing an initial voltage difference (e.g., via pre-charging of BL3 and BLB), between the two bitlines BL3 and BLB. The supplied sensing current is generally much less than any one of the SOT or STT threshold switching currents to prevent perturbations of the magnetic polarizations in the magnetic recording layers during the readout. A voltage drop detectable between the second top electrode 13b and the second terminal 16b of the conductor 12 is proportional to the sensing current and the resistance configuration in the magnetic recording layers of the common electrode 32 and the first magnetic electrode 14a of the first MTJ 14, respectively. If the two written bits are both a logical high or both a logical low, e.g., "00" or "11", these two magnetic recording layers are oriented parallel to each other and the resulting magnetoresistance is adopting its lower value. If on the contrary the two written bits are different, e.g., one bit being a logical high and the other bit being a logical low, e.g., "01" or "10", the two magnetic recording layers are oriented antiparallel to each other and the resulting magnetoresistance is adopting its higher value. Hence, whether the corresponding voltage drop is large or small is determined as a functional output of the Boolean XOR operation performed on the first and second bit that have been written earlier to the stack 31. If the small and large voltage drops are not suitable for representing logic levels, a sensing unit 43 may compare, or first amplify and then compare, the detected voltage drop to a threshold or reference voltage level, e.g., by means of a comparator unit, to restore the logic levels. Besides, the non-volatile memory device 30 can be used as a standalone logic block for evaluating the Boolean XOR-function accepting the first and second written bit as inputs. In the context of machine learning applications, e.g., for the purpose of evaluating XOR functions arising in binary neural networks, the second written bit preferably corresponds to the neural network weight—which in the non-volatile memory device 30 is reused several times for different activations to reduce the energy overhead of repeated read/write cycles—and the first written bit represents the activation input received, because repeated writing of activation inputs to the memory device 30 is better supported by the SOT mechanism which has lower characteristic power dissipation and higher endurance in the absence of tunneling currents. Writing of the weight and the activation is controlled by the control signal WL0 and ACT0, respectively. In addition thereto, also the writing of activation inputs can be reduced by storing the previous activation input in a latch and only rewriting a later received activation input to the non-volatile memory device 30 if this differs from the one stored in the latch. The sensing unit 43 may also be adapted to detect a voltage drop between the two pre-charged bitlines BL3, BLB in response to a Boolean XOR readout performed concurrently on each memory cell 28 of a same column of the array 80. The detected voltage drop results from cumulated sense currents flowing through each memory cell 28 of the sensed column and the sensing unit 43 may digitize the detected voltage drop and compare the result to a plurality of incremental thresholds to obtain the sum of all memory cells 28 which are configured to yield XOR=TRUE. Alternatively, the voltage drop may be detected by the sensing unit 43 sequentially for each cell 28 of an array column. An additional summing unit 44, e.g., a multi-bit adder, may be provided and configured to receive the comparison outcomes from the sensing unit 43. Therefore, the material layer stack 31 can be used in memory cells 28 of an array 80 with in-memory computing capability, such as acting as a multiply-and-accumulator unit in a dedicated neural network acceleration hardware.

In embodiments of the disclosure relating to reading and writing methods of memory cells of an arrayed memory structure described above, the memory cells of a same row may be written and/or read in parallel or in sequence. Moreover, the skilled person does not face any difficulties in replacing currents by voltages and in providing adequate current sensing and current comparison means instead of voltage sensing and comparison means. For instance, the skilled person may replace predetermined sensing currents by predetermined sensing voltages and sense the resulting current flow through the stack or memory device instead of voltage drops.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed is:

1. A material layer stack for a non-volatile memory device, comprising:
    a lower first end face and an upper second end face;
    a first magnetic tunnel junction and a second magnetic tunnel junction adapted for magnetic polarization switching assisted by spin-orbit torque and spin-torque transfer respectively, each of the magnetic tunnel junctions having an associated reconfigurable magnetoresistance adapted for storing a bit;
    a first top electrode formed on the upper second end face;
    a shoulder formed on a lateral face of the material layer stack to divide the material layer stack into an upper stack portion and a lower stack portion;
    a tunnel barrier of the first magnetic tunnel junction arranged in the lower stack portion;
    a tunnel barrier of the second magnetic tunnel junction arranged in the upper stack portion; and
    a second top electrode formed on the shoulder,
    wherein a first magnetic electrode of the second magnetic tunnel junction and a second magnetic electrode of the first magnetic tunnel junction are provided as a single layer magnetic electrode common to both magnetic tunnel junctions, and
    wherein a partially exposed top surface of the single layer magnetic electrode is vertically delimiting the shoulder.

2. The material layer stack according to claim 1, wherein the shoulder comprises a partially exposed intermediate surface of the material layer stack on which the upper stack portion abuts the lower stack portion, the second top electrode being formed on an exposed portion of the partially exposed intermediate surface.

3. The material layer stack according to claim 1, wherein each of a first magnetic electrode of the first magnetic tunnel junction, facing the lower first end face, and a second magnetic electrode of the second magnetic tunnel junction, facing the upper second end face, comprises a magnetic recording layer having a magnetic polarization that is switchable between two predetermined directions, and the single layer magnetic electrode comprises a magnetic pinned layer having a fixed magnetic polarization direction.

4. The material layer stack according to claim 1, wherein the single layer magnetic electrode comprises a magnetic recording layer having a magnetic polarization direction that is switchable between two predetermined directions, and a first magnetic electrode of the first magnetic tunnel junction, facing the lower first end face, comprises another magnetic recording layer having a magnetic polarization direction that is switchable between the two predetermined directions.

5. The material layer stack according to claim 1, wherein the first and second magnetic tunnel junctions are configured according to an in-plane magnetic anisotropy or a perpendicular magnetic anisotropy.

6. A non-volatile memory device comprising the material layer stack according to claim 1 and a conductor with contact terminals disposed on both ends thereof, the conductor being in electrical contact with the lower first end face of the material layer stack.

7. The non-volatile memory device according to claim 6, wherein the conductor and/or a non-magnetic conducting layer provided at the lower first end face of the material layer stack comprises a heavy metal-based material suitable for current-induced switching of the magnetoresistance associated with the first magnetic tunnel junction via spin-orbit torque.

8. A memory circuit comprising:
    an array of memory cells arranged in rows and columns, each memory cell comprising the non-volatile memory device according to claim 7 and at least first and second electronically controlled switches coupled to one of the first and second top electrodes of the material layer stack and one of the contact terminals of the non-volatile memory device, respectively, for controlling a write access to the memory cell;
    at least three bitlines corresponding to each column of the array and logically arranged as a first pair of bitlines and a second pair of bitlines, the contact terminals of the non-volatile memory device being operatively connectable to the bitlines of the first pair via the first switch at least, and the top electrodes of the material layer stack being operatively connectable to the bitlines of the second pair via the second switch;
    first and second wordlines corresponding to each row of the array, each of the first and second wordlines being configured to transmit control signals to control terminals of the first or the second switches in that row;
    at least one power source adapted for supplying writing currents for switching the magnetoresistances associated with the first and the second magnetic tunnel junction of memory cells of the array; and
    a sensing unit adapted for detecting bitline currents or voltage drops indicative of magnetoresistance states associated with the memory cells of the array.

9. A method for writing two data bits into the material layer stack of claim 1, the method comprising:
    supplying a first current for writing a first data bit by spin-orbit torque with polarity depending on the first data bit, and directing the supplied first current through or past the lower first end face of the stack adjacent to the first magnetic tunnel junction; and
    supplying a second current for writing a second data bit by spin-transfer torque with a polarity depending on the second data bit, and directing the supplied second current between the first top electrode and the second top electrode of the material layer stack and through the second magnetic tunnel junction.

10. The method according to claim 9, wherein the first current and the second current are supplied at the same time, or wherein the first current and the second current are supplied in sequence, and/or wherein supplying the first current, the second current, or both, comprises applying a control signal to a control terminal of an electronic switch for enabling or disabling a flow of the supplied current to shape a current pulse.

11. A method for reading out two data bits stored in the material layer stack of claim 1, the method comprising:
    supplying a first predetermined sensing current to the first top electrode and directing the supplied sensing current through the second magnetic tunnel junction to the second top electrode;
    supplying a second predetermined sensing current to the lower first end face of and directing the supplied sensing current through the first magnetic tunnel junction to the second top electrode;

comparing voltage drops across the upper and lower stack portions in response to the first and second sensing currents, respectively, to first and second reference voltages to detect a high magnetoresistance configuration or a low magnetoresistance configuration associated with each of the first and second magnetic tunnel junctions; and generating output signals representative of the first and second data bit stored in the material layer stack based on the detected magnetoresistance configuration for the first and second magnetic tunnel junctions.

12. A method for reading out two-bit configurations of two data bits stored in the material layer stack of claim 1, the method comprising:

supplying a predetermined sensing current to the first top electrode and directing the supplied sensing current through the first magnetic tunnel junction and the second magnetic tunnel junction to the lower first end face;

comparing a voltage drop across the material layer stack in response to the sensing current to one reference voltage or to a set of reference voltages comprising at least first and second reference voltages to detect one of the group comprising high, low, and intermediate magnetoresistance configurations associated with the material layer stack; and generating an output signal representative of the two-bit configuration of the two data bits stored in the material layer stack based on the detected magnetoresistance configuration.

13. A method of performing a boolean XOR function on two data bits written into the material layer stack of claim 1, the method comprising:

supplying a predetermined sensing current to the second top electrode for non-perturbative probing of a magnetoresistance configuration of the first magnetic tunnel junction, and directing the supplied sensing current through the first magnetic tunnel junction to the lower first end face;

comparing a voltage drop across the lower stack portion in response to the supplied sensing current to a reference voltage; and generating an output signal indicative of the XOR function based on an outcome of the comparison.

14. A method of using the memory circuit according to claim 8, wherein the method comprises using the memory circuit as multiply-and-accumulator unit for assisting in performing machine learning applications.

15. A material layer stack for a non-volatile memory device, comprising:

a lower first end face and an upper second end face;

a first magnetic tunnel junction and a second magnetic tunnel junction adapted for magnetic polarization switching assisted by spin-orbit torque and spin-torque transfer respectively, each of the magnetic tunnel junctions having an associated reconfigurable magnetoresistance adapted for storing a bit;

a first top electrode formed on the upper second end face;

a shoulder formed on a lateral face of the material layer stack to divide the material layer stack into an upper stack portion and a lower stack portion;

a tunnel barrier of the first magnetic tunnel junction arranged in the lower stack portion;

a tunnel barrier of the second magnetic tunnel junction arranged in the upper stack portion; and a second top electrode formed on the shoulder, wherein a first magnetic electrode of the second magnetic tunnel junction and a second magnetic electrode of the first magnetic tunnel junction are provided as a single layer magnetic electrode common to both magnetic tunnel junctions and comprising a magnetic recording layer having a magnetic polarization direction that is switchable between two predetermined directions, and wherein a first magnetic electrode of the first magnetic tunnel junction, facing the lower first end face, comprises another magnetic recording layer having a magnetic polarization direction that is switchable between two predetermined directions.

16. The material layer stack according to claim 15, wherein the first and second magnetic tunnel junctions are configured according to an in-plane magnetic anisotropy or a perpendicular magnetic anisotropy.

17. A non-volatile memory device comprising the material layer stack according to claim 15 and a conductor with contact terminals disposed on both ends thereof, the conductor being in electrical contact with the lower first end face of the material layer stack.

18. The non-volatile memory device according to claim 17, wherein the conductor and/or a non-magnetic conducting layer provided at the lower first end face of the material layer stack comprises a heavy metal-based material suitable for current-induced switching of the magnetoresistance associated with the first magnetic tunnel junction via spin-orbit torque.

19. A memory circuit comprising:

an array of memory cells arranged in rows and columns, each memory cell comprising a non-volatile memory device comprising a material layer stack, the material layer stack comprising:

a lower first end face and an upper second end face, a first magnetic tunnel junction and a second magnetic tunnel junction adapted for magnetic polarization switching assisted by spin-orbit torque and spin-torque transfer respectively, each of the magnetic tunnel junctions having an associated reconfigurable magnetoresistance adapted for storing a bit, a first top electrode formed on the upper second end face; a shoulder formed on a lateral face of the material layer stack to divide the material layer stack into an upper stack portion and a lower stack portion, and a tunnel barrier of the first magnetic tunnel junction arranged in the lower stack portion; a tunnel barrier of the second magnetic tunnel junction arranged in the upper stack portion; and a second top electrode formed on the shoulder;

the non-volatile memory device further comprising a conductor with contact terminals disposed on both ends thereof, the conductor being in electrical contact with the lower first end face of the material layer stack, wherein the conductor and/or a non-magnetic conducting layer provided at the lower first end face of the material layer stack comprises a heavy metal-based material suitable for current-induced switching of the magnetoresistance associated with the first magnetic tunnel junction via spin-orbit torque; each memory cell further comprising at least first and second electronically controlled switches coupled to one of the first and second top electrodes of the material layer stack and one of the contact terminals of the non-volatile memory device, respectively, for controlling a write access to the memory cell;

at least three bitlines corresponding to each column of the array and logically arranged as a first pair of bitlines and a second pair of bitlines, the contact terminals of the non-volatile memory device being operatively connectable to the bitlines of the first pair via the first switch at least, and the top electrodes of the material layer stack being operatively connectable to the bitlines of the second pair via the second switch;

first and second wordlines corresponding to each row of the array, each of the first and second wordlines being configured to transmit control signals to control terminals of the first or the second switches in that row;

at least one power source adapted for supplying writing currents for switching the magnetoresistances associated with the first and the second magnetic tunnel junction of memory cells of the array; and a sensing unit adapted for detecting bitline currents or voltage drops indicative of magnetoresistance states associated with the memory cells of the array.

* * * * *